United States Patent
Iwai et al.

(10) Patent No.: US 11,665,822 B2
(45) Date of Patent: May 30, 2023

(54) ELECTRONIC DEVICE

(71) Applicant: Japan Display Inc., Tokyo (JP)

(72) Inventors: Youhei Iwai, Tokyo (JP); Hideaki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/568,009

(22) Filed: Jan. 4, 2022

(65) Prior Publication Data

US 2022/0132667 A1 Apr. 28, 2022

Related U.S. Application Data

(63) Continuation of application No. 16/898,942, filed on Jun. 11, 2020, now Pat. No. 11,252,819.

(30) Foreign Application Priority Data

Jun. 26, 2019 (JP) .............................. JP2019-118324

(51) Int. Cl.
*H05K 1/02* (2006.01)
*H05K 1/14* (2006.01)
*H05K 1/03* (2006.01)

(52) U.S. Cl.
CPC ............. *H05K 1/147* (2013.01); *H05K 1/028* (2013.01); *H05K 1/0277* (2013.01); *H05K 1/0278* (2013.01); *H05K 1/0393* (2013.01); *H05K 1/0298* (2013.01); *H05K 2201/09027* (2013.01); *H05K 2201/09063* (2013.01); *H05K 2201/10681* (2013.01)

(58) Field of Classification Search
CPC ...... H05K 1/147; H05K 1/028; H05K 1/0298; H05K 2201/09063; H05K 2201/09027; H05K 2201/10128; H05K 2201/09018; H05K 1/0271; H05K 2201/09036; H05K 1/0278; G09F 9/30
See application file for complete search history.

(56) References Cited

U.S. PATENT DOCUMENTS

| | | | | |
|---|---|---|---|---|
| 2016/0324027 | A1* | 11/2016 | Ahn ..................... | H05K 1/147 |
| 2017/0139249 | A1* | 5/2017 | Moon ................... | G02F 1/1368 |
| 2018/0098427 | A1* | 4/2018 | Park ..................... | H05K 1/142 |
| 2020/0029437 | A1* | 1/2020 | Jin ....................... | G02F 1/13452 |
| 2020/0315015 | A1* | 10/2020 | Kim ..................... | G09G 3/20 |

FOREIGN PATENT DOCUMENTS

WO 2010-122781 A1 10/2010

OTHER PUBLICATIONS

Japanese Office Action dated Dec. 27, 2022, for the corresponding Japanese Patent Application No. 2019-013784, with English machine translation.

* cited by examiner

*Primary Examiner* — Steven T Sawyer
(74) *Attorney, Agent, or Firm* — Michael Best & Friedrich LLP

(57) ABSTRACT

An electronic device comprising: a substrate having a curved surface, a printed circuit board, and plural flexible wiring substrates, each of two of the plural flexible substrates has a terminal portion that is connected to the curved surface, the printed circuit board has a cutout between the two flexible wiring substrates.

7 Claims, 22 Drawing Sheets

(STRUCTURE A)

(STRUCTURE B)

(STRUCTURE C)

(STRUCTURE D)

(STRUCTURE E)

(STRUCTURE F)

ELECTRONIC DEVICE

CROSS-REFERENCE TO RELATED APPLICATIONS

This application is a continuation of U.S. patent application Ser. No. 16/898,942, filed on Jun. 11, 2020. Further, this application claims priority from Japanese Patent Application JP 2019-118324 filed on Jun. 26, 2019, the entire contents of which are hereby incorporated by reference into this application.

BACKGROUND OF THE INVENTION

(1) Field of the Invention

The present invention relates to the electronic devices, like display devices, sensor substrates and so forth, which the substrates can be used in curved state.

(2) Description of the Related Art

Self-luminous type display devices like the organic EL display device and the micro-LED display device, and other display devices like the liquid crystal display device and the electrophoresis display device are sometimes required to be used in curved state because of their application and their design needs. In addition, not only display devices but touch panels or sensor substrates for e.g. photo sensors are also sometimes required to be used in curved state according the design of equipment that those devices are installed. The curving direction can be in lateral axis (may be expressed x axis) or in longitudinal axis (may be expressed as y axis).

The display device comprises a display panel, printed circuit board, in which several circuits are installed to supply powers and signals to the display device, and a flexible wiring substrate to connect the printed circuit board and the display panel. The flexible wiring substrate is folded so that the printed circuit board is set at the back of the display panel to make the outer dimension of the display device small in total.

The patent document 1 discloses to provide a hole in the printed circuit board to accommodate the IC driver so that the IC driver does not protrude outwardly from the surface of the printed circuit board. The patent document 1 also discloses to separate the printed circuit board into two parts; each of the separated printed circuit boards and the curved display panel are connected by plural flexible wiring substrates.

PRIOR TECHNICAL DOCUMENT

Patent Document

Patent document 1: Japanese patent application laid open No. 2018-97223

SUMMARY OF THE INVENTION

The structure, which one side of the flexible wiring substrate is connected to the curved side of the display panel and another side of the flexible wiring substrate is connected to the printed circuit board, produces a stress in the connection portions between the flexible wiring substrate and the display panel and between the flexible wiring substrate and the printed circuit board. The reason is that the printed circuit board, in which circuits are formed on the glass epoxy substrate and various electronic components are installed, is flat and comparatively rigid.

In addition, in order to make the outer dimension of the display device small, when the printed circuit board is folded to the back of the display panel, the stress in the connection portions between the flexible wiring substrate and the display panel and between the flexible wiring substrate and the printed circuit board becomes very big. Consequently, the reliability of the connections between the flexible wiring substrate and the display panel and between the flexible wiring substrate and the printed circuit board becomes a problem. Concretely, electrical connection at those connections or peeling off of the substrates at the connection portion becomes a problem.

The purpose of the present invention is to mitigate the stress at the connection terminal and keep high reliability of connection in the structure, in which one side of the flexible wiring substrate is connected to the curved side of the display panel and another side of the flexible wiring substrate is connected to the printed circuit board.

The present invention overcomes the above explained problem; the concrete structures are as follows.

(1) An electronic device comprising: a substrate having a curved surface, a printed circuit board, and plural flexible wiring substrates,
each of two of the plural flexible substrates has a terminal portion that is connected to the curved surface,
the printed circuit board has a cutout between the two flexible wiring substrates.

(2) The electronic device according to (1), wherein a major surface of the printed circuit board is flat.

(3) The electronic device according to (1), wherein the printed circuit board is folded to a back of the substrate through the plural flexible substrate, and the printed circuit board is flat.

(4) An electronic device comprising: a substrate having a curved surface, a printed circuit board, and plural flexible wiring substrates,
each of two of the plural flexible substrates has a terminal portion that is connected to the curved surface,
the printed circuit board has a thinner portion between the two flexible wiring substrates than other portion of the printed circuit board.

DETAILED DESCRIPTION OF THE PREFERRED EMBODIMENTS

The present invention will be described in detail referring to the following embodiments. The present invention can be applied to various display devices as display devices having photo-electrical layers like the liquid crystal display device or the electrophoresis display device, or self-luminous display devices as organic EL display device and the micro LED device. In addition to the display devices, the present invention is applicable to other electronic devices like sensor devices, e.g. the external touch sensor or the finger print sensor, etc.

Further, in addition to the display devices and the sensor devices, the present invention is applicable to other electronic devices that the flexible wiring substrates are used. In such cases, in the following explanations, the display panel can be substituted by sensor substrate of the sensor device or the substrate that the flexible wiring substrate is connected to in the electronic device.

Embodiment 1

Figure 1:
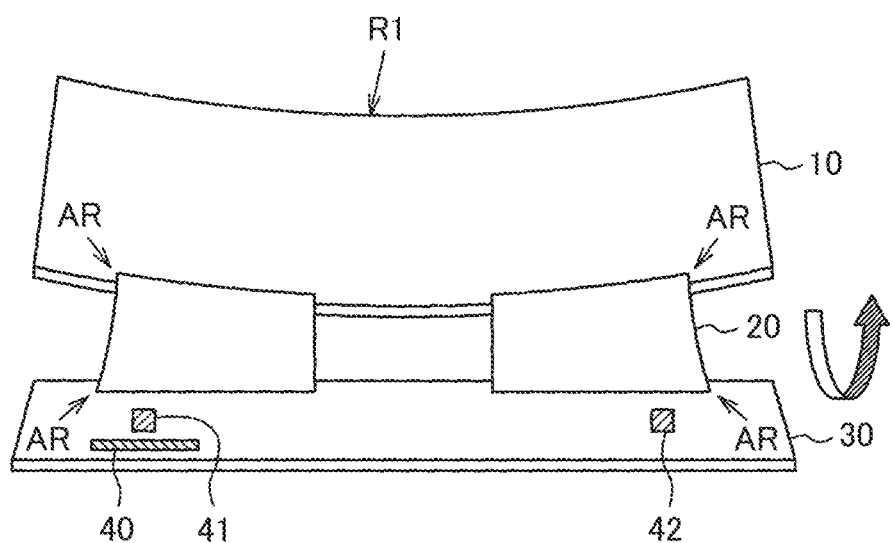
FIG. 1 is a perspective view that the curved display panel and the printed circuit board are connected by two flexible wiring substrates.

FIG. 1 is a development plan view of a curved display device according to the present invention before it is folded. In FIG. 1, the display panel 10 is curved. Such a display device is used as e.g. various display apparatus in a dashboard of a car. The printed circuit board 30 is set opposing to the curved side of the display panel 10; the printed circuit board 30 and the curved side of the display panel 10 are connected by the two flexible wiring substrates 20. As depicted in FIG. 1, the flexible wiring substrate 20 is connected to the curved side of the display panel 10.

The display panel 10 is curved by radius of curvature R1 of 800 mm, on the other hand, the printed circuit board 30 is approximately flat. Therefore the flexible wiring substrate 20, which connects the display panel 10 and the printed circuit board 30, has a stress at the connection portions; especially at the portions indicated by arrows in FIG. 1. Such stresses give bad influence to connections between the display panel 10 and the flexible wiring substrate 20 and between the printed circuit board 30 and the flexible wiring substrate 20.

In FIG. 1, the substrate of the display panel 10 is made of e.g. glass and a thickness is e.g. 0.15 mm. A protecting plate or supporting plate having a predetermined curvature is adhered by adhesive to the front surface or the back surface of the display panel 10 to give predetermined curvature to the display panel 10.

The printed circuit board 30, which is made of laminated glass epoxy sheets, is flat, a thickness is approximately 0.5 mm to 2.5 mm, and is comparatively rigid. Several electronic components as the controller IC 41, the power generation circuit 42, and the interface 40, which means e.g. connector and so forth, are installed in the printed circuit board 30.

The flexible wiring substrate 20 is made of polyimide, and a thickness is approximately 0.1 mm. The flexible wiring substrate 20 itself is rectangle; however, the flexible wiring substrate 20 in FIG. 1 is deviated from the rectangle since it connects the display panel 10, which is curved, and the printed circuit board 30, which is flat. Since the flexible wiring substrate 20 is deformed, a stress is produced at the connection terminals. In the display device in FIG. 1, the printed circuit board 30 is folded to the back of the display panel 10 as depicted by the partly shaded broad arrow in FIG. 1 to make the outer dimension of the display device small.

Figure 2:
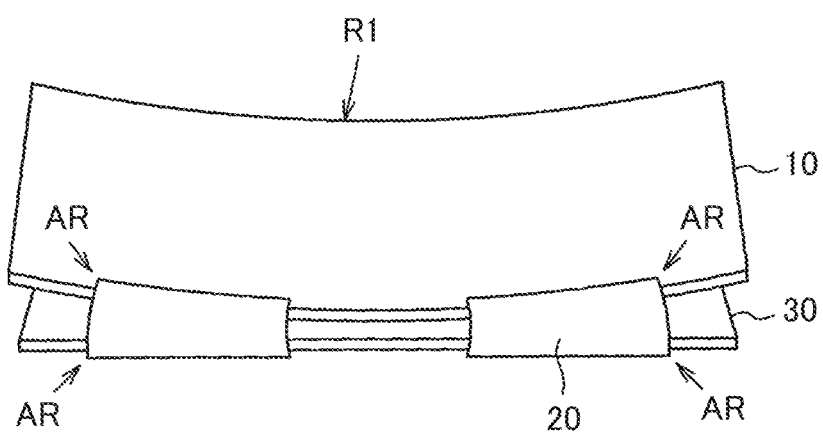
FIG. 2 is a perspective view that the printed circuit board is folded to the back of the curved display panel.

FIG. 2 is a perspective view that the printed circuit board 30 is folded back to the display panel 10. In this case, in addition to the stress in the state of FIG. 1, the flexible wiring substrate 20 gets a big and complex stress including a twist stress caused by being folded to the back of the display panel 10. As a result, a big peeling off stress is generated at the connection terminals between the flexible wiring substrate 20 and the display panel 10 or between the flexible wiring substrate 20 and the printed circuit board 30; consequently, a danger arises that an electrical connection fails in those connection terminals.

Figure 3:
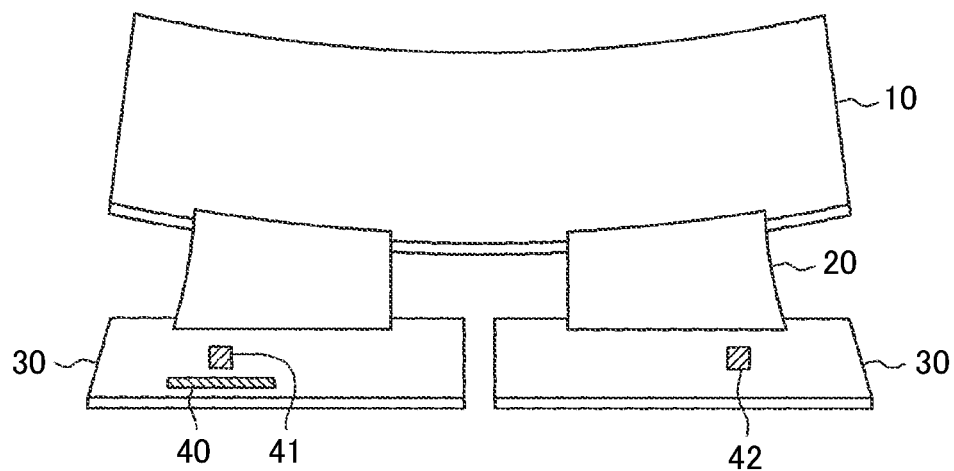
FIG. 3 is a perspective view that the printed circuit board is divided into two.

To countermeasure this problem, it is conceivable to divide the printed circuit board into two parts as depicted in FIG. 3. By the way, in general, one controller IC 41 and one power generation circuit 42 are installed in the printed circuit board 30. The controller IC 41, the power generation circuit 42, and interface 40 etc. must commonly work in the two printed circuit board 30. Consequently, a means to connect the two printed circuit boards 30 is necessary. It is conceivable to install the controller IC 41, the power generation circuit 42, and the interface 40 into each of the two printed circuit boards 30; however, that measure is not preferable from the view of the manufacturing cost. In addition, a synchronizing means for the two printed circuit boards is necessary; thus, connection means for the two printed circuit boards is still necessary.

Figure 4:
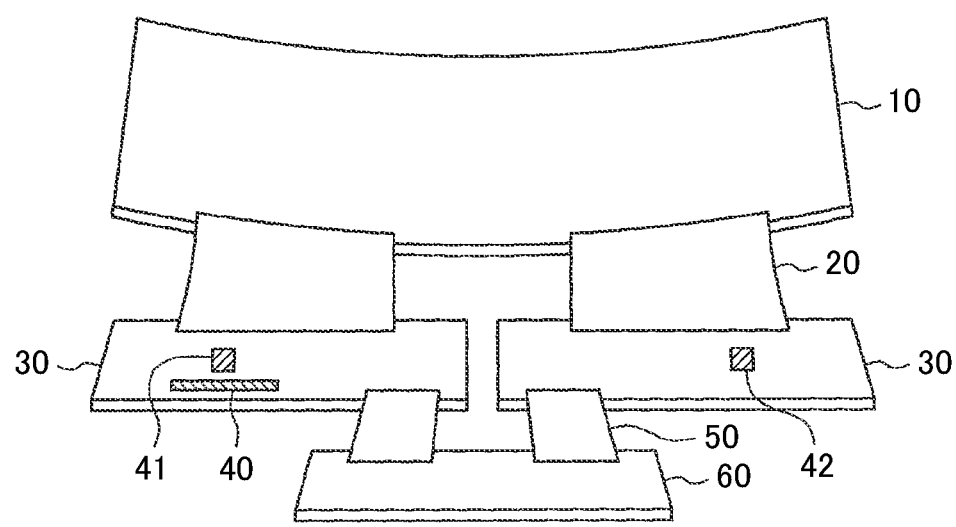
FIG. 4 is a perspective view that second flexible wiring substrates and the second printed circuit board are disposed.

FIG. 4 is an example that a second printed circuit board 60 and the second flexible wiring substrates 50 are disposed to connect two printed circuit boards 30. The structure of FIG. 4, however, needs additional components, which arises additional cost; in addition, a space for the second printed circuit board 60 and the second flexible wiring substrates 50 is necessary.

Figure 5:
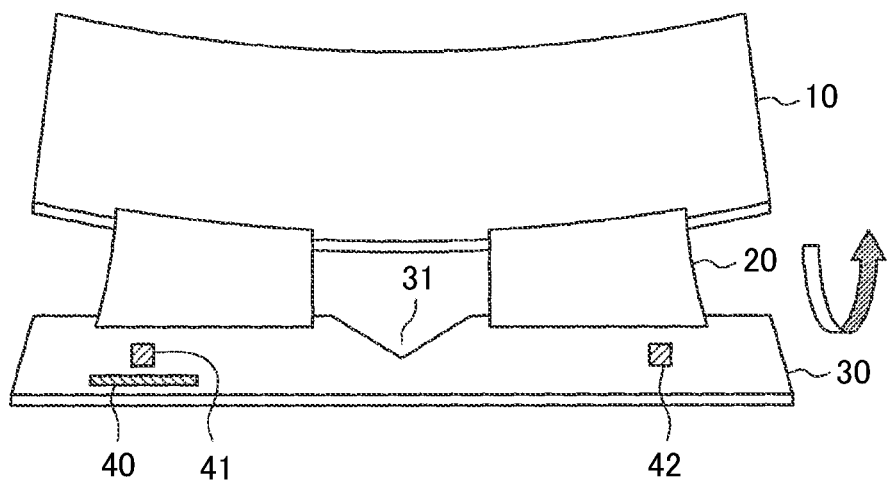
FIG. 5 is a perspective view of the structure of embodiment 1.

FIG. 5 is a development plan view of embodiment 1 of the present invention that countermeasures the above explained problem. FIG. 5 features that the V shaped cutout 31 is formed in the printed circuit board 30 between the two flexible wiring substrates 20. Thus, the section modulus of the printed circuit board 30 at the V shaped cutout 31 is made smaller; consequently, the printed circuit board 30 becomes not completely rigid and is allowed to be bent at the V shaped cutout 31. Therefore, the stress at the connections between the flexible wiring substrate 20 and the printed circuit board 30 and between the flexible wiring substrate 20 and the display panel 10 are mitigated.

In FIG. 5, the printed circuit board 30 remains as one piece, thus, the controller IC 41, the power generation circuit 42 and interface 40 can work for entire printed circuit board 30. Other structure of FIG. 5 is the same as explained in FIG. 1. In FIG. 5, the printed circuit board 30 is folded to the back of the display panel 10 as depicted by the half shaded broad arrow, and then, is installed in the apparatus. A perspective view after the printed circuit board 30 is folded to the back of the display panel 10 is the same as FIG. 2.

Figure 6:
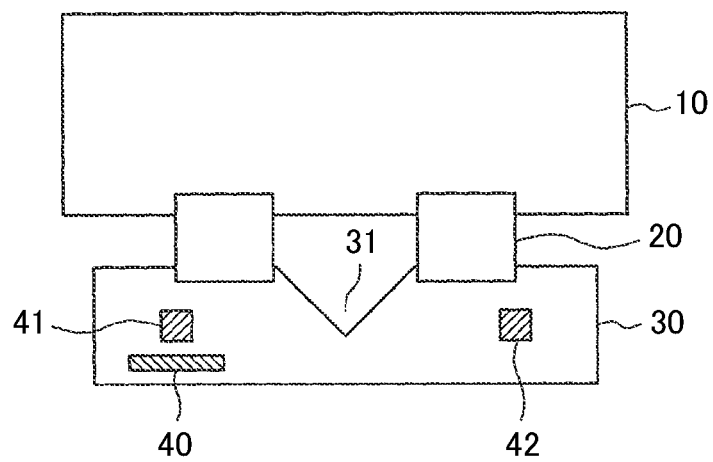
FIG. 6 is a plan view of embodiment 1 before the display panel is curved.

FIG. 6 is a plan view of FIG. 5 before the display panel 10 is curved. In FIG. 6, the plan view of the flexible wiring substrate 20, which connects the display panel 10 and the printed circuit board 30, remains rectangle since both of the display panel 10 and the printed circuit board 30 are flat. The V shaped cutout 31 is formed at approximately center of the side of the printed circuit board 30, which opposes to the display panel 10.

Figure 7:
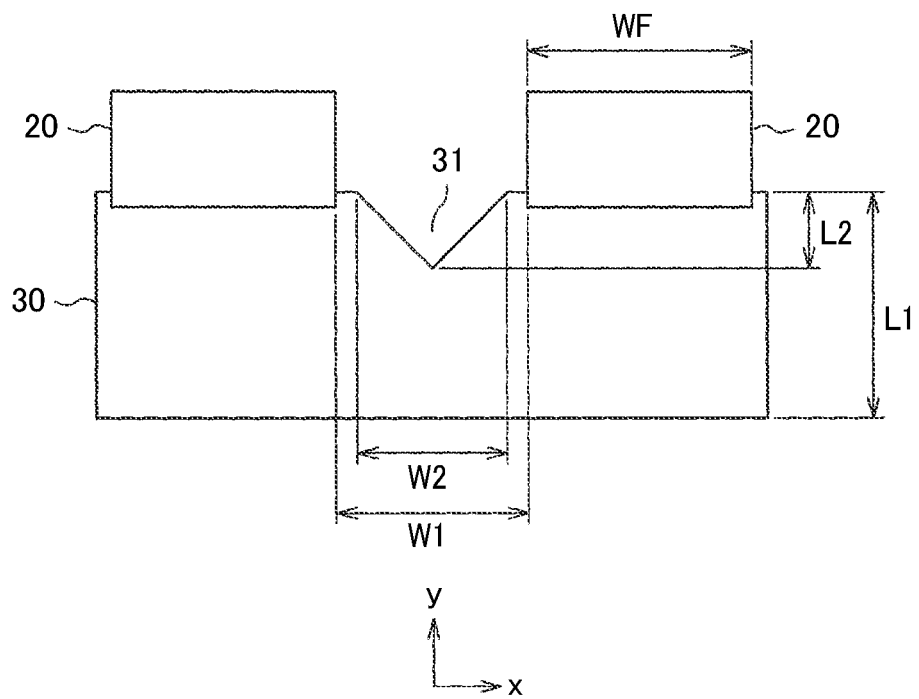
FIG. 7 is an enlarged plan view of the portion of V shaped cutout of the printed circuit board.

FIG. 7 is an enlarged view of the printed circuit board 30 at the V shaped cutout 31. In FIG. 7, the tip of the V shaped cutout 31 is at approximately the center of the space between the two flexible wiring substrates 20. Provided the distance between the two flexible wiring substrates 20 is W1 and the opening width of the V shaped cutout 31 is W2, $0.4 \times W1 \leq W2 \leq 1.0 \times W1$ is satisfied. In addition, provided the width of the printed circuit board 30 in y direction is L1 and the depth of the V shaped cutout 31 in y direction is L2, $0.3 \times L1 \leq L2 \leq 0.7 \times L1$ is satisfied.

In the above case, the width WF of the flexible wiring substrate 20 in x direction is 50 mm; the distance W1 between the two flexible wiring substrates 20 in x direction is 25 mm. In the meantime, when the display panel 10 is curved, the stresses at the connections between the display panel 10 and the flexible wiring substrate 20 and between the flexible wiring substrate 20 and the printed circuit board 30 become bigger when the width WF of the flexible wiring substrate 20 is bigger and when the distance in y direction between the display panel 10 and the printed circuit board 30 is smaller. In any events, however, the V shaped cutout 31 in the printed circuit board 30 between the flexible wiring substrates 20 mitigates the stress at the connections.

The bigger values of the opening W2 and the depth L2 can decrease the stresses at the connections between the display panel 10 and the flexible wiring substrate 20 and between the flexible wiring substrate 20 and the printed circuit board 30; however, a design liberty of wring in the printed circuit board 30 is restricted when the values of W2 and L2 are too big. Therefore, there is a tradeoff between the stress at the connection terminals and the design liberty of wiring in the printed circuit board 30. In the meantime, the tip of the V shaped cutout 31 can be a sharp angle or round r.

FIGS. 8-21 show how the V shaped cutout 31 disclosed in FIGS. 5 and 6 in the printed circuit board 30 gives an effect to mitigation in stress at the connection terminals by taking an example when the display panel 10 is the liquid crystal display panel.

Figure 8:
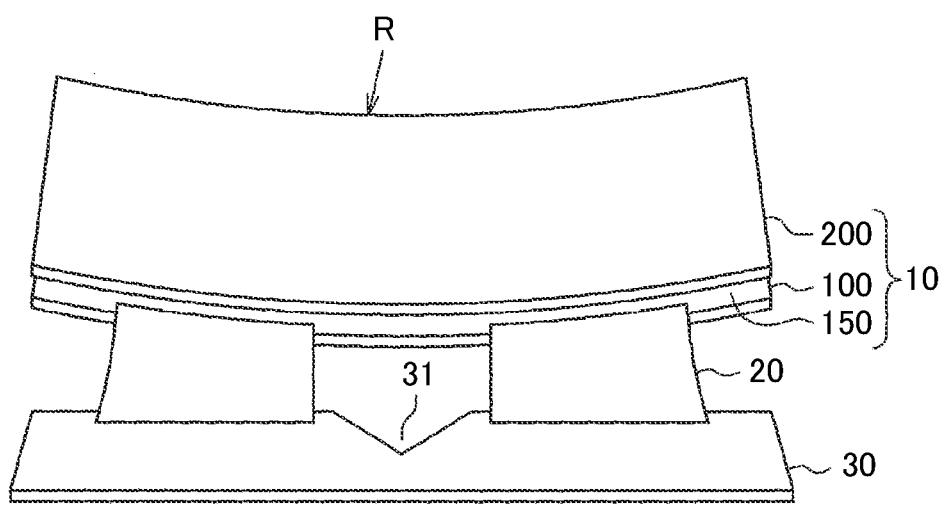
FIG. 8 is a perspective view of the structure of embodiment 1 when the display panel is the liquid crystal display panel.

FIG. 8 is a perspective view for simulation of the stress at the connection terminal. FIG. 8 is the same as FIG. 5; however, the liquid crystal display panel is used as the display panel 10. The liquid crystal display panel 10 comprises: the TFT substrate 100, in which the signal wirings, TFTs, and so on are formed, the counter substrate 200, in which color filters and so forth are formed, opposing to the TFT substrate 100, and the liquid crystal layer, sandwiched between the TFT substrate 100 and the counter substrate 200. A thickness of each of the TFT substrate 100 and the counter substrate 200 is 0.15 mm.

The area that the TFT substrate 100 and the counter substrate 200 do not overlap is the terminal area 150, namely, this area is on the TFT substrate 100 only. Other structures of FIG. 8 is the same as FIG. 5. In the simulation, the area, where the TFT substrate 100 and the counter substrate 200 overlap, curves by predetermined radius of curvature; the terminal area 150, where only the TFT substrate exists, to which the flexible wiring substrate 20 is connected to, constitutes a free end.

When the display panel 10 is bent from the state of FIG. 6 to the state of FIG. 8, stresses arises at the connections between the printed circuit board 30 and the flexible wiring substrate 20 and between the display panel 10 and the flexible wiring substrate 20. The bigger the stress, the bigger the problem of reliability in the connection terminals. FIGS. 9-14 are plan views of printed circuit boards 30 in the structures that the simulation is conducted. Among them, FIG. 14 does not have the cutout in the printed circuit board 30.

Figure 9:
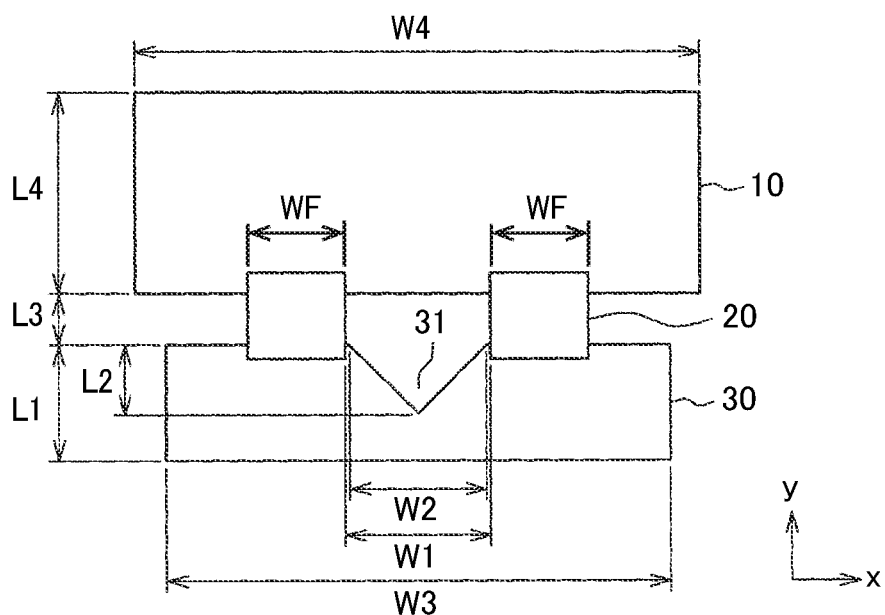
FIG. 9 is the structure A for simulation.

FIG. 9 shows a structure A, which is a representative form of embodiment 1; the V shaped cutout 31 is formed in the printed circuit board 30 between the two flexible wiring substrates 20. FIG. 9 is the same as FIG. 6, however, sizes of the components for the simulation are written. In FIG. 9, the width W3 of the printed circuit board 30 in x direction is 272 mm, the length L1 in y direction is 72 mm, the width W2 of the V shaped cutout 31 is 98 mm, the depth L2 of the V shaped cutout 31 is 36 mm; the width W4 of the display panel 10 in x direction is 302 mm, length L4 in y direction is 120 mm; the width WF of the flexible wiring substrate 20 in x direction is 48 mm, the distance W1 between the two flexible wiring substrates in x direction is 100 mm. The distance L3 between the display panel 10 and the printed circuit board 30 in y direction is 18 mm. The corresponding dimensions in FIGS. 10 to 14 are the same except specifically noted.

Figure 10:
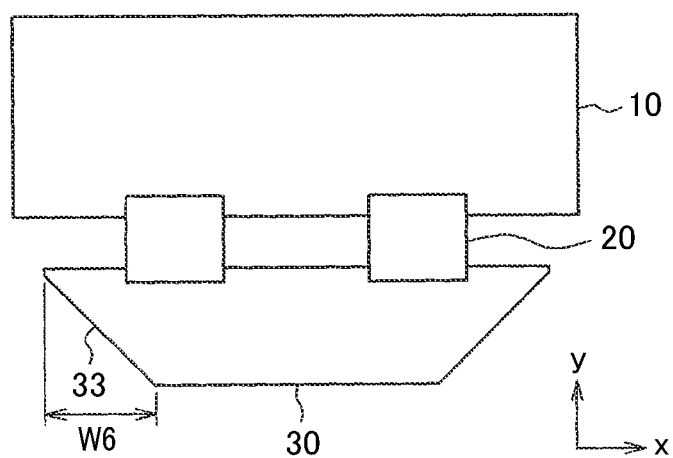
FIG. 10 is the structure B for simulation.
Figure 11:
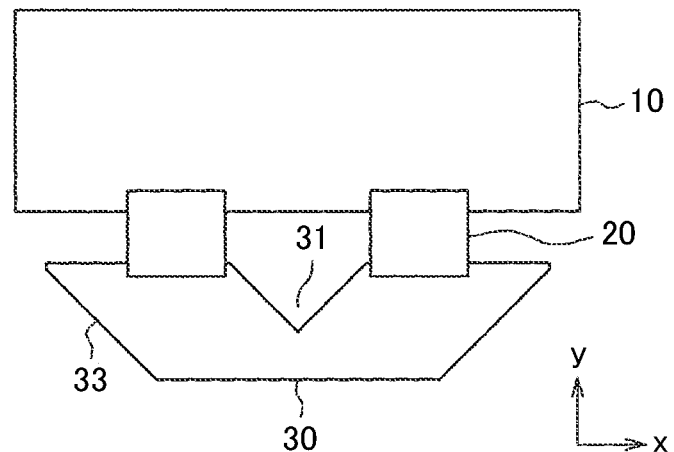
FIG. 11 is the structure C for simulation.

FIG. 10 shows structure B, which has the side cutouts 33, where the two sides of the printed circuit boards 30 are obliquely cut out. The width W6 of the side cutout 33 in x direction is 72 mm. FIG. 11 shows structure C, in which side cutouts 33 are added to the structure A of FIG. 9.

Figure 12:
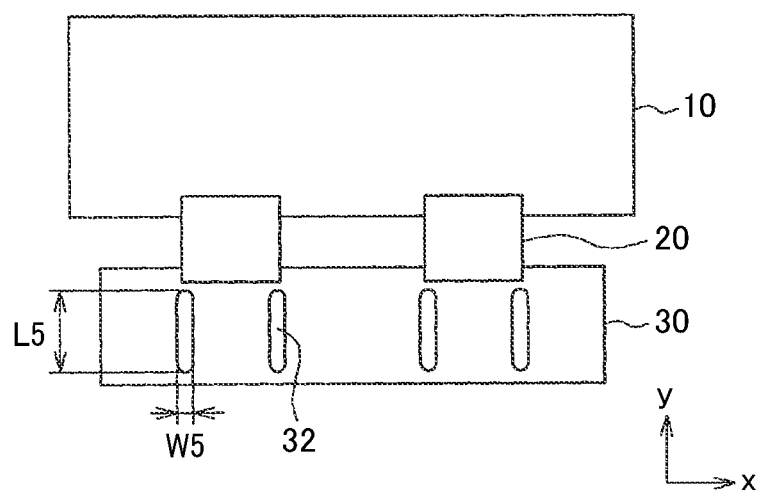
FIG. 12 is the structure D for simulation.

FIG. 12 shows structure D, in which slits 32 are formed in the printed circuit board 30. The width W5 of the slit in x direction is 5 mm, the length L5 in y direction is 54 mm; the shape of the slit 32 at the end is a half circle of radius of (W5)/2. The slits 32 in the printed circuit board 30 are set at the end of the flexible wiring substrates.

Figure 13:
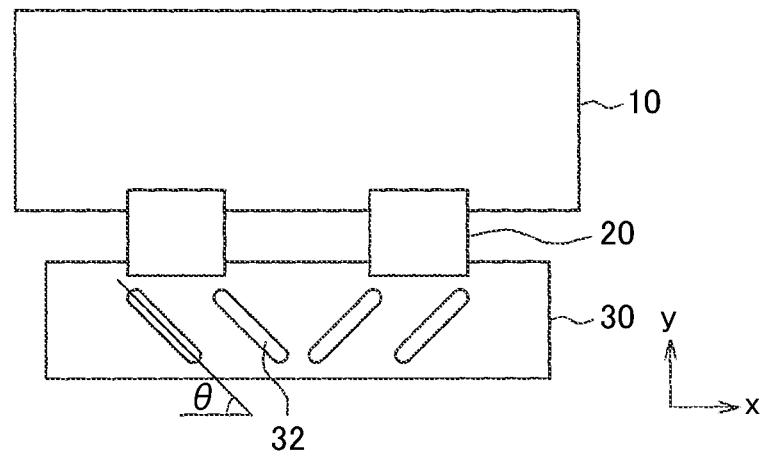
FIG. 13 is the structure E for simulation.
Figure 14:
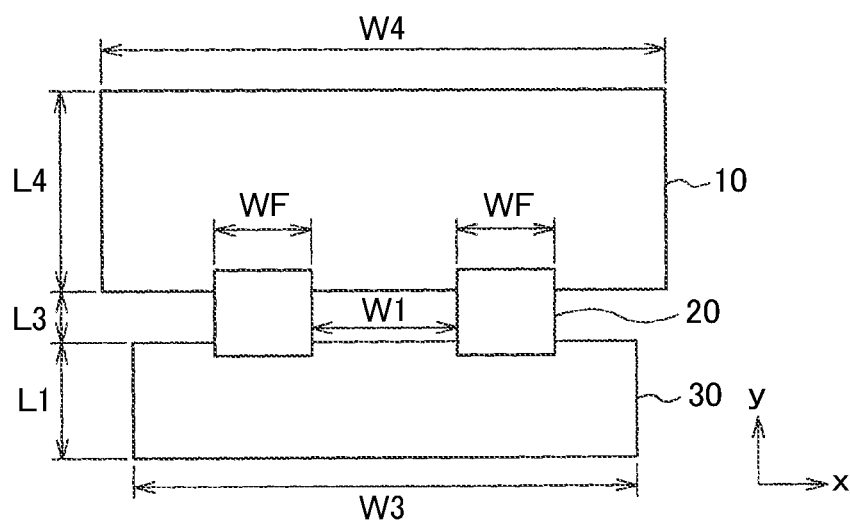
FIG. 14 is the structure F for simulation.

FIG. 13 shows structure E, in which slits 32 are formed in oblique to the sides of the printed circuit board 30. In FIG. 13, the angle θ is approximately 60 degrees. FIG. 14 shows structure F, in which the printed circuit board 30 is rectangle, namely, the same as the prior art.

FIGS. 15-20 show the deformation values at the various places in the display panel 10, the flexible wiring substrate 20 and printed circuit board 30, and the maximum load value in each of the structures A to F shown in FIGS. 9-14 when the terminal area of the display panel 10 is curved so that a height of the end of the terminal area becomes 12 mm.

Figure 15:
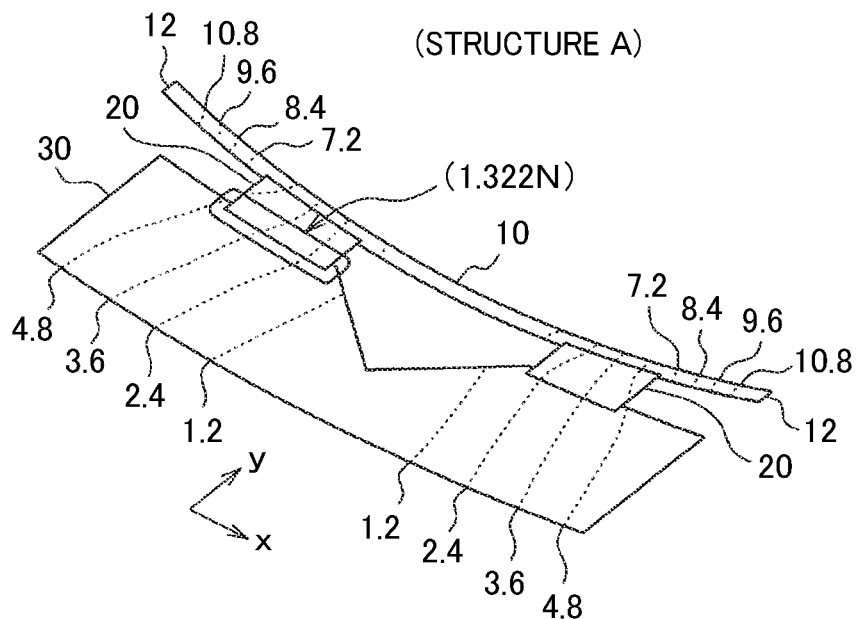
FIG. 15 is a perspective view that shows the result of simulation of the structure A.
Figure 16:
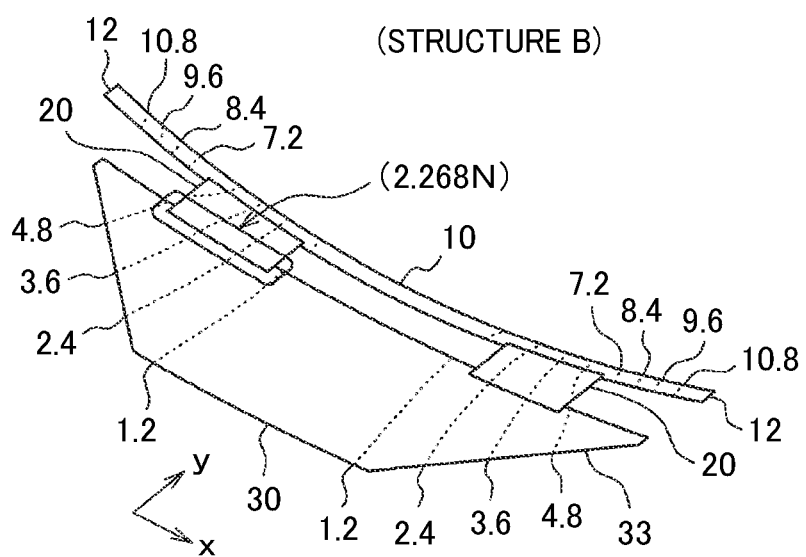
FIG. 16 is a perspective view that shows the result of simulation of the structure B.
Figure 17:
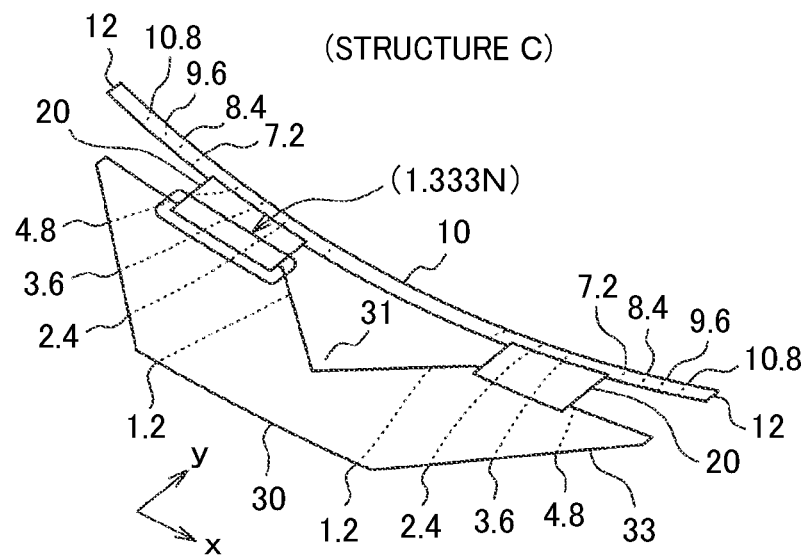
FIG. 17 is a perspective view that shows the result of simulation of the structure C.
Figure 18:
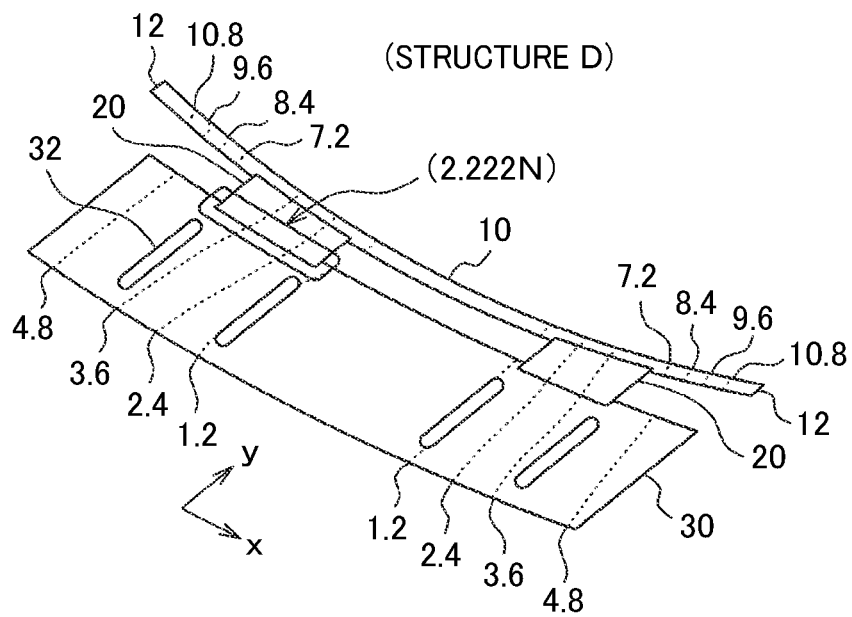
FIG. 18 is a perspective view that shows the result of simulation of the structure D.
Figure 19:
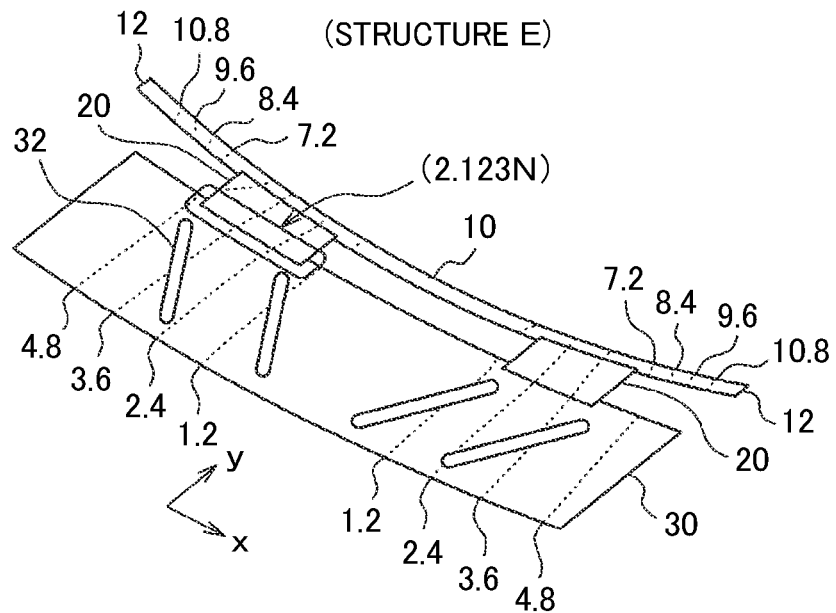
FIG. 19 is a perspective view that shows the result of simulation of the structure E.

In FIGS. 15 to 20, the deformations of the display panel 10 and the printed circuit board 30 at the center in x direction is zero. In FIGS. 15 to 20, the dotted lines indicate contours in the components; the numerals corresponding to the dotted lines indicate the heights, namely, values of deformation. By the way, in FIGS. 15 to 20, the numerals for the dotted lines are smaller than the numerals that indicate the components. In FIGS. 15 to 20, the connection portion between the flexible wiring substrate 20 and the printed circuit board 30 is framed; the numeral corresponding to the framed portion indicates a total load value in the framed connection portion. For example, the maximum load value in the connection portion in FIG. 15 is 1.322 N (Newton).

Figure 20:
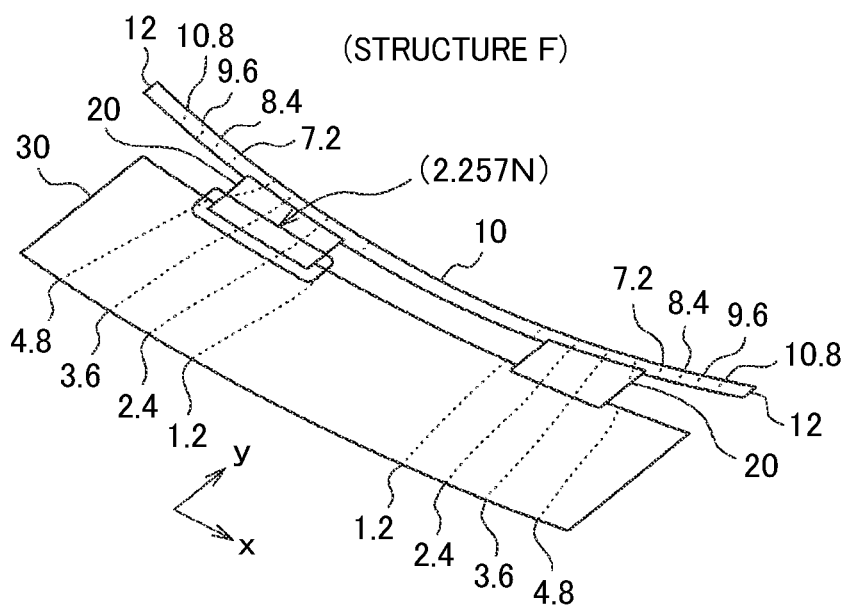
FIG. 20 is a perspective view that shows the result of simulation of the structure F.

In comparing FIG. 15 (structure A) to FIG. 20 (structure F), there is not a big difference in the deformation values in the display panel 10, the flexible wiring substrate 20 and the printed circuit board 30 among those specifications. On the other hand, the load values at the connection portion between the flexible wiring substrate 20 and the printed circuit board 30 is much smaller in the cases of FIG. 15 (structure A) and FIG. 17 (structure C), in which V shaped cutout 31 is formed in the printed circuit board 30 between the two flexible wiring substrates 20 compared with the cases of FIG. 16 (structure B), FIG. 18 (structure D) and FIG. 20 (structure F). Therefore, the effect of V shaped cutout 31 is very big for decreasing the load value at the connection portion.

Figure 21:
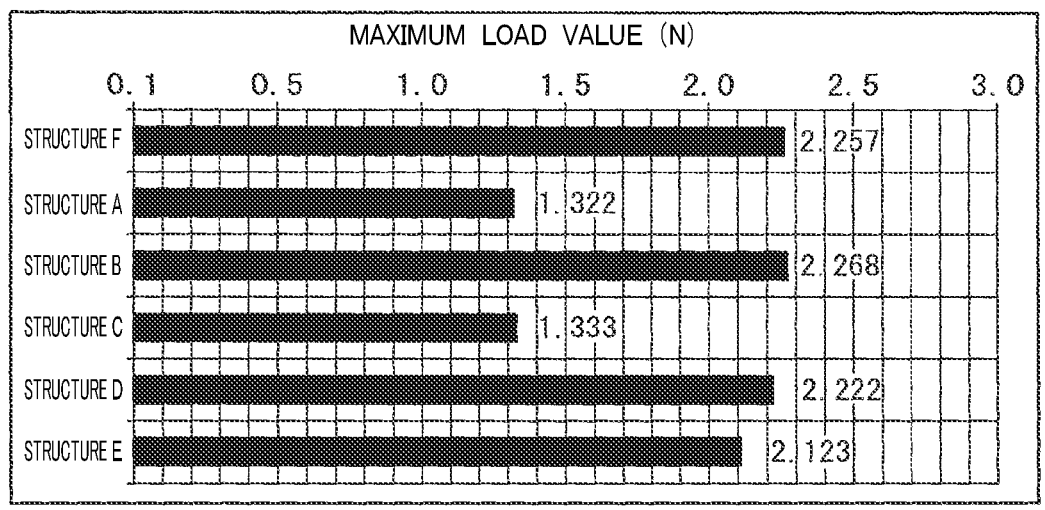
FIG. 21 is a table that summarizes the results of the simulation.

FIG. 21 is a table that shows comparison of maximum load values among the structures A to F. In FIG. 21, the structure F, which no measure is added and is considered as a base for comparison, is listed at the upper most row. In FIG. 21, the maximum load value of the structure F is 2.257 N, while the maximum load value of the structure A, which has the V shaped cutout 31, is 1.322 N, which is 40% less compared with the value of the structure F.

In FIG. 21, the structure C has an oblique cutout at the sides of the printed circuit board in addition to the V shaped cutout 31; the maximum load value of the structure C is 1.333 N, which is substantially the same as the value of the structure A. Therefore, the V shaped cutout 31 in the printed circuit board 30 has an essential role to decrease the load value in the connection portion.

FIGS. 15-20 and 21 are figures that evaluate the load value at the connection portion between the flexible wiring substrate 20 and the printed circuit board 30; evaluation of the load values at the connection portion between the flexible wiring substrate 20 and the display panel 10 is the same. Namely, since the load value at the connection portion is caused by curving the display panel 10, the load value between the flexible wiring substrate 20 and the display panel 10 is generated as a reaction of the load value between the flexible wiring substrate 20 and the printed circuit board 30.

By the way, when the display device is installed, the printed circuit board 30 is folded to the back of the display panel 10. Further, bigger load values are generated, by folding the printed circuit board 30 to the back of the display panel 10, between the printed circuit board 30 and the flexible wiring substrate 20, and between the display panel 10 and the flexible wiring substrate 20. The relative relations of the load values are the same as shown in FIG. 21. Therefore, there is no change that the v shaped cutout 31 greatly decreases the load values at the connection portions.

Embodiment 2

Figure 22:
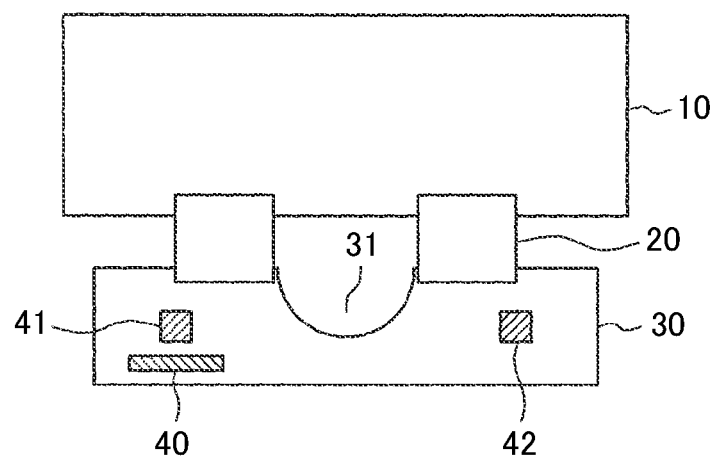
FIG. 22 is a plan view that the semicircle shaped cutout is formed in the printed circuit board, which is an example of embodiment 2.

Embodiment 1 discloses examples to form the V shaped cutout 31 in the printed circuit board 30 between the two flexible wiring substrates 20. The load values between the printed circuit board 30 and the flexible wiring substrate 20 and between the display panel 10 and the flexible wiring substrate 20 when the display panel 10 is curved can also be decreased by other shaped cutout 31 as well as the V shaped cutout 31. Embodiment 2 discloses several examples of cutouts 33. FIG. 22 shows an example that the semicircle shaped cutout 31 is formed instead of the V shaped cutout 31.

Figure 23:
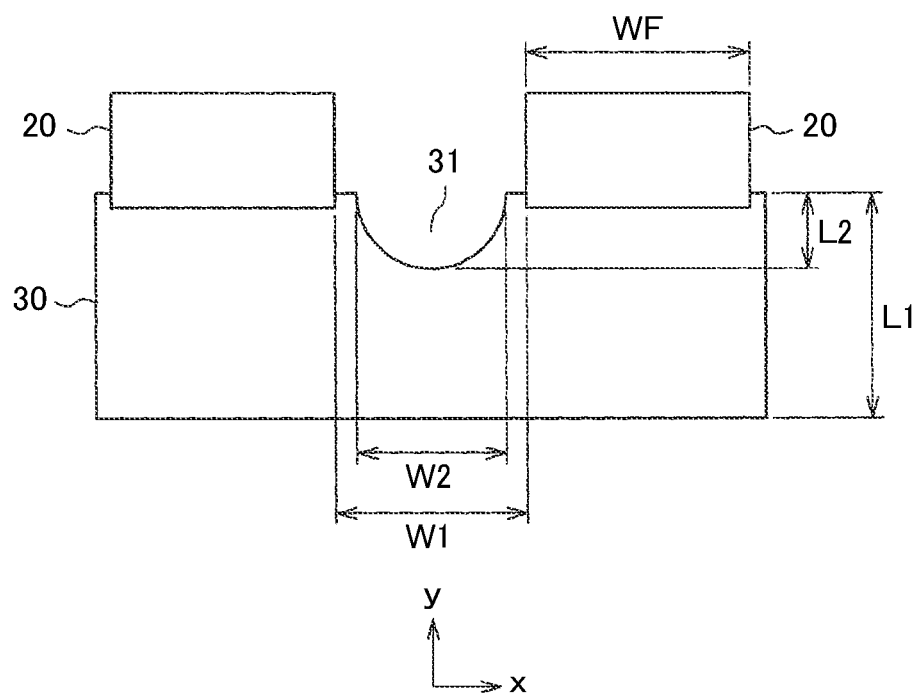
FIG. 23 is an enlarged view of the printed circuit board at the semicircle shaped cutout.

FIG. 23 is an enlarged plan view to show the semicircle shaped cutout 31 and its vicinity of the printed circuit board 30. In FIG. 23, the center of the semicircle shaped cutout 31 is at the center of the space between the two flexible wiring substrates 20. Provided the distance between the two flexible substrates is W1 and the opening width of the semicircle shaped cutout 31 is W2, $0.4 \times W1 \leq W2 \leq 1.0 \times W1$ is satisfied. In addition, provided the width of the printed circuit board 30 in y direction is L1 and the depth of the semicircle shaped cutout 31 in y direction is L2, $0.3 \times L1 \leq L2 \leq 0.7 \times L1$ is preferable. In this case, the width WF of the flexible wiring substrate in x direction is e.g. 50 mm; the distance W1 between the two flexible wiring substrates 20 in x direction is 25 mm.

Figure 24:
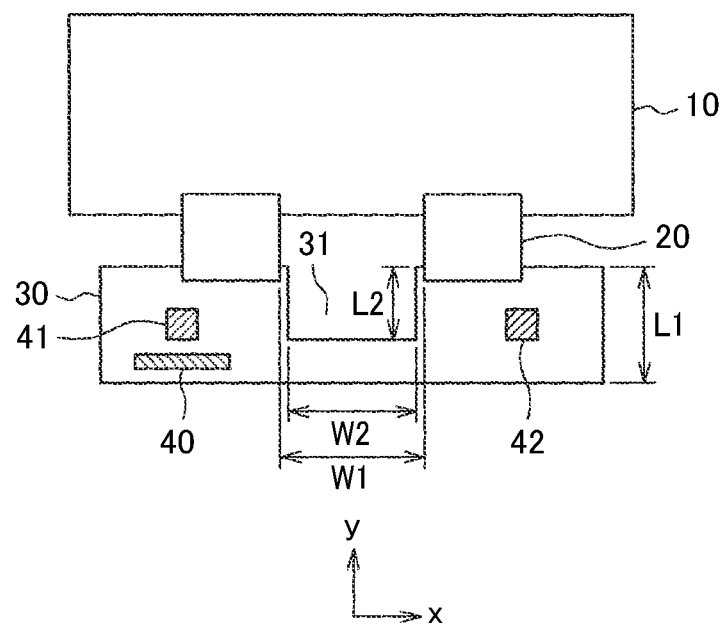
FIG. 24 is a plan view that the rectangular cutout is formed in the printed circuit board.

FIG. 24 discloses the cutout 31 is rectangle. The examples of dimensions of the rectangular shaped cutout 31 is the same as those of the V shaped cutout 31 and the semicircle shaped cutout 31. Namely, provided the distance between the two flexible wiring substrate 20 is W1 and the opening width of the rectangular shaped cutout 31 is W2, $0.4 \times W1 \leq W2 \leq 1.0 \times W1$ is satisfied. In addition, provided the width of the printed circuit board 30 in y direction is L1 and the depth of the rectangular shaped cutout 31 in y direction is L2, $0.3 \times L1 \leq L2 \leq 0.7 \times L1$ is preferable.

Figure 25:
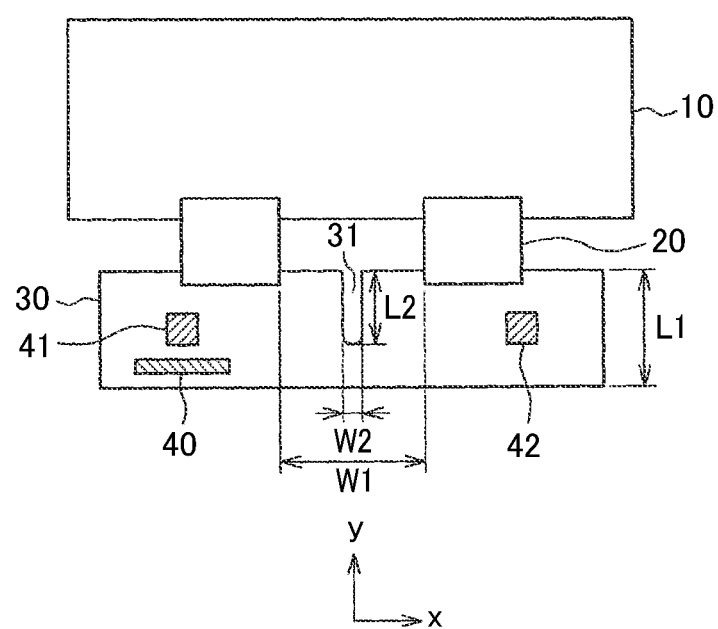
FIG. 25 is a plan view that the slit shaped cutout is formed in the printed circuit board.

FIG. 25 shows a variation of the cutout 31, in which the opening width of the rectangular cutout is very narrow and the tip is semicircle. This is called slit shaped cutout 31. In this case, provided the distance between the two flexible wiring substrate is W1 and the opening width of the slit shaped cutout 31 is W2, $0.1 \times W1 \leq W2 \leq 0.4 \times W1$ is preferable. In addition, provided the width of the printed circuit board 30 in y direction is L1 and the depth of the slit shaped cutout 31 in y direction is L2, $0.3 \times L1 \leq L2 \leq 0.7 \times L1$ is satisfied.

Figure 26:
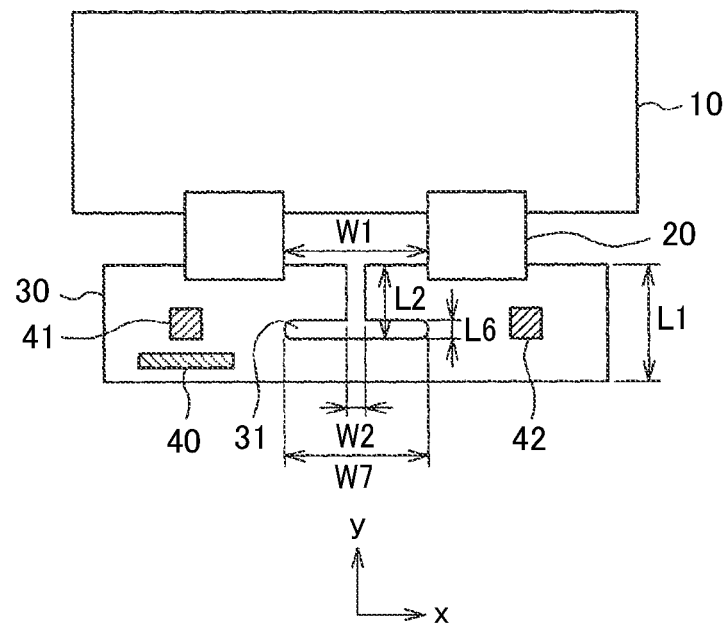
FIG. 26 is a plan view that the T shaped cutout is formed in the printed circuit board.

FIG. 26 is another example of the cutout 31, in which the tip of the cutout is widened so that the slit becomes T shaped. This is called T shaped cutout 31. In this case, provided the distance between the two flexible wiring substrate 20 is W1 and the opening width of the slit shaped cutout 31 is W2, $0.1 \times W1 \leq W2 \leq 0.4 \times W1$ is preferable. In addition, provided the width of the printed circuit board 30 in y direction is L1 and the depth of the T shaped cutout 31 in y direction is L2, $0.3 \times L1 \leq L2 \leq 0.7 \times L1$ is preferable. Wherein W1>W2 and L1>L2. The width W7 of the laterally extended portion of the T shaped cutout 31 in x direction is e.g. $0.4 \times W1 \leq W7 \leq 1.0 \times W1$. In addition, provided the width L6 in y direction of the laterally extended portion of the T shaped cutout 31, $0.1 \times L1 \leq L6 \leq 0.3 \times L1$ is satisfied.

Other examples for the cutout 31 can be ellipse, parabola or other shapes. The cutout 31 can be a combination of the above explained shapes. The cutout 31 preferably exists between the two flexible wiring substrates 20, and at the side, opposing to the display panel 10, of the printed circuit board 30.

Embodiment 3

Figure 27:
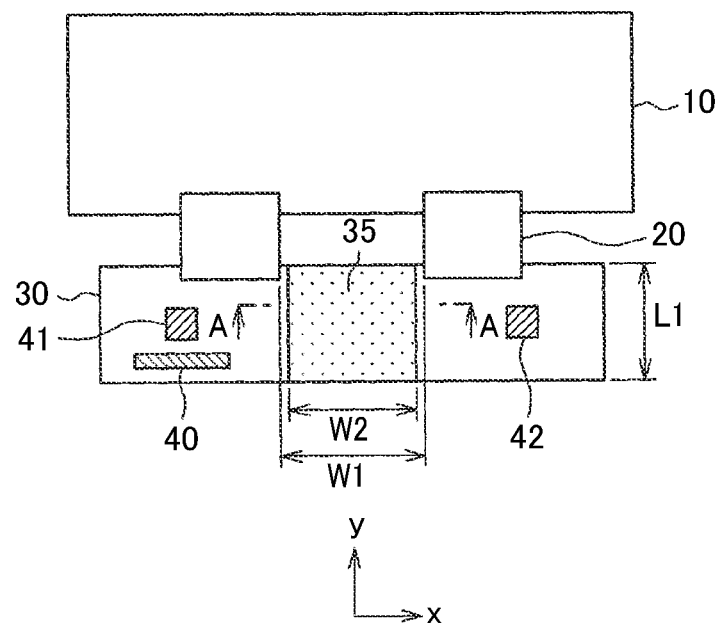
FIG. 27 is a plan view of an example of embodiment 3.

FIG. 27 is a plan view of embodiment 3. The structure of FIG. 27 is to form the thin area 35 in the printed circuit board 30 between the two flexible wiring substrates to decrease bending strength in this area of the printed circuit board 30, and thus, to decrease the stress at the connection portions between the display panel 10 and the flexible wiring substrate 20 and between the printed circuit board 30 and the flexible wiring substrate 20. In FIG. 27, provided the distance between the two flexible wiring substrates 20 is W1 and the width of the thin area in x direction is W2, the relation is $W2 \leq W1$.

Figure 28:
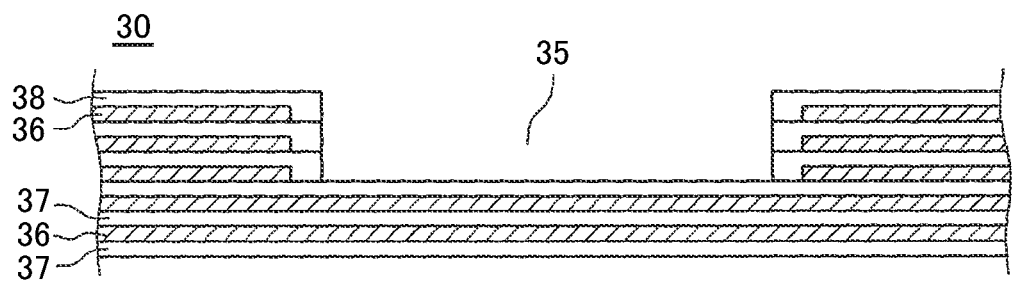
FIG. 28 is a cross sectional view along the A-A line of FIG. 27.

FIG. 28 is a cross sectional view along the line A-A of FIG. 27. In many cases, printed circuit board 30 is formed by laminating plural layers. Namely, the thin films, which wirings 36 are formed on the resin layer 37, are laminated by adhesive. FIG. 28 shows that such five films are laminated, and the wirings 36 on the upper most film is covered by protective layer 38.

The thin portion 35 in FIG. 27 corresponds to the structure in FIG. 28 that upper three layers are eliminated. In FIG. 28, the wrings formed on one side of the printed circuit board 30 is connected to another side of the printed circuit board 30 through wrings formed on the two film layers.

Figure 29:
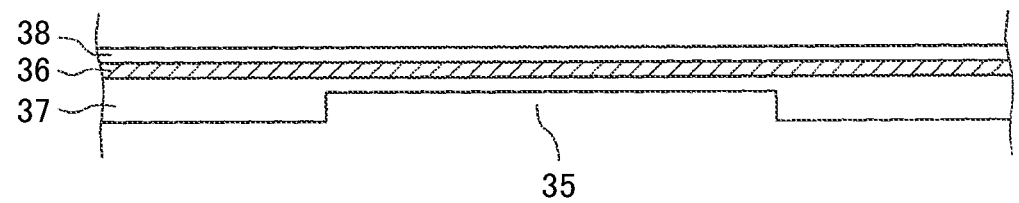
FIG. 29 is another example of a cross sectional view along the A-A line of FIG. 27.

FIG. 29 is a cross sectional view along A-A line of FIG. 22 where the printed circuit board is formed by one resin layer. In FIG. 29, the thin portion 35 is formed in the resin layer 37. The recess is formed on the back side of the resin layer 37, thus, disconnection caused by step can be avoided. The protective layer 38 covers the wirings 36 in FIG. 29.

Figure 30:
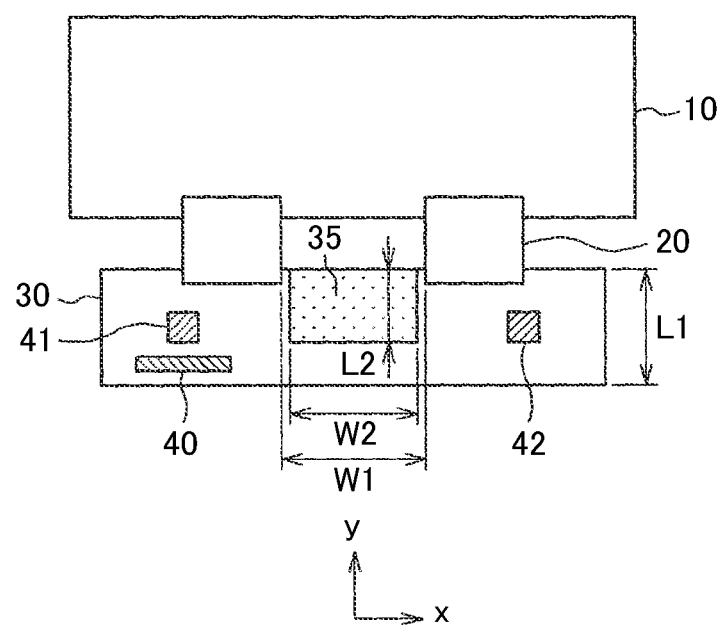
FIG. 30 is another example of embodiment 3.

FIG. 30 discloses that the thin portion 35 is formed at the area nearer to the display panel 10 in the printed circuit board 30 not entire width of the printed circuit board 30 in y direction. In FIG. 30, provided the distance between the two flexible wiring substrates 20 is W1 and the width of the thin portion in x direction is W2, then $W2 \leq W1$. In addition, provided the width in y direction of the printed circuit board 30 is L1 and the width in y direction of the thin portion is L2, then, e.g. $0.3 \times L1 \leq L2 \leq 0.7 \times L1$ is satisfied. The structure of FIG. 30 gives more liberty in designing wirings in the printed circuit board 30 as well as decreases the stress at the connection portion.

Embodiment 4

Embodiments 1 to 3 explain the display panel 10 and the printed circuit board 30 are connected by two flexible wiring substrates 20. When the display panel 10 becomes bigger, or the radius of curvature of the curved display panel 10 becomes small, there arises a case that three or more flexible wiring substrates 20 are necessary to connect the display panel 10 and the printed circuit board 30.

Figure 31:
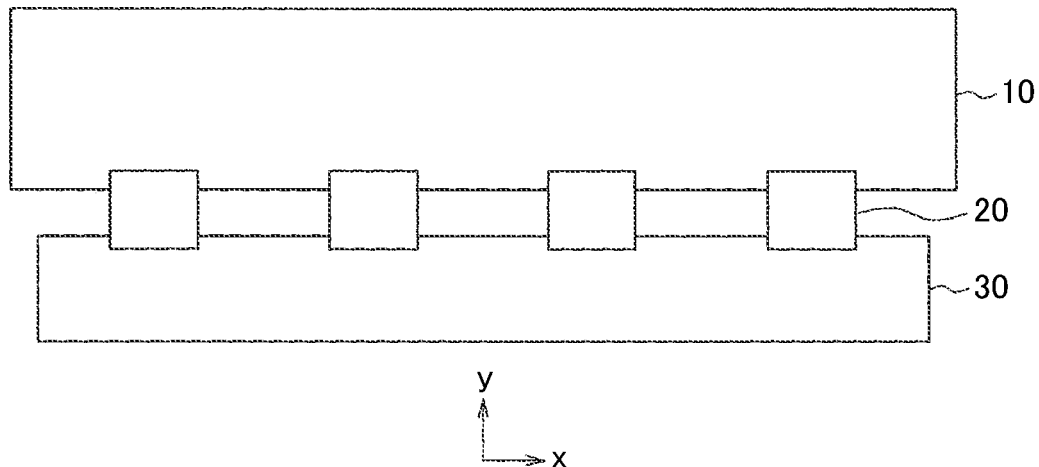
FIG. 31 is a plan view that the display panel and the printed circuit board are connected by four flexible wiring substrates.

FIG. 31 is an example that the display panel 10 and the printed circuit board 30 are connected by four flexible wiring substrates 20. In FIG. 31, the printed circuit board 30 is one piece; consequently, when the display panel 10 is curved and when the printed circuit board 30 is folded to the back of the display panel 10, the stress arises at the connection portions between the display panel 10 and the flexible wiring substrate 20 and between the printed circuit board 30 and the flexible wiring substrate 20 as explained in embodiment 1.

Figure 32:
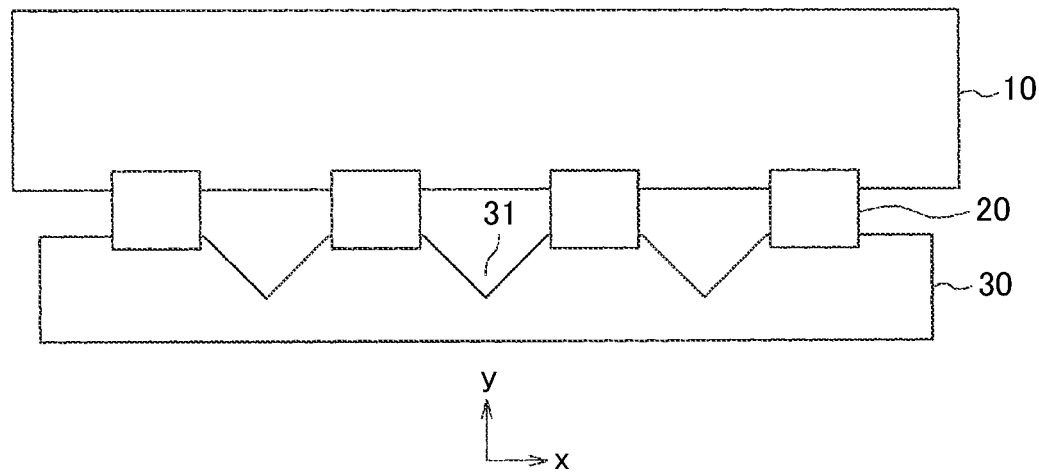
FIG. 32 is a first example of embodiment 4.

FIG. 32 is an example that the V shaped cutout 31 is formed in the printed circuit board 30 between the flexible wiring substrates 20 to decrease the stress at the connection portions between the display panel 10 and the flexible wiring substrate 20 and between the printed circuit board 30 and the flexible wiring substrate 20. The dimensions of the V shaped cutout 31 and its function are the same as explained in embodiment 1. The stress generated in the flexible wiring substrate 20 according to curving of the display panel 10 is bigger at the sides than at the center of the printed circuit board 30; therefore, the shape or the dimensions of the V shaped cutout 31 in the printed circuit board 30 can be changed between at the center and at the sides of the printed circuit board 30.

Figure 33:
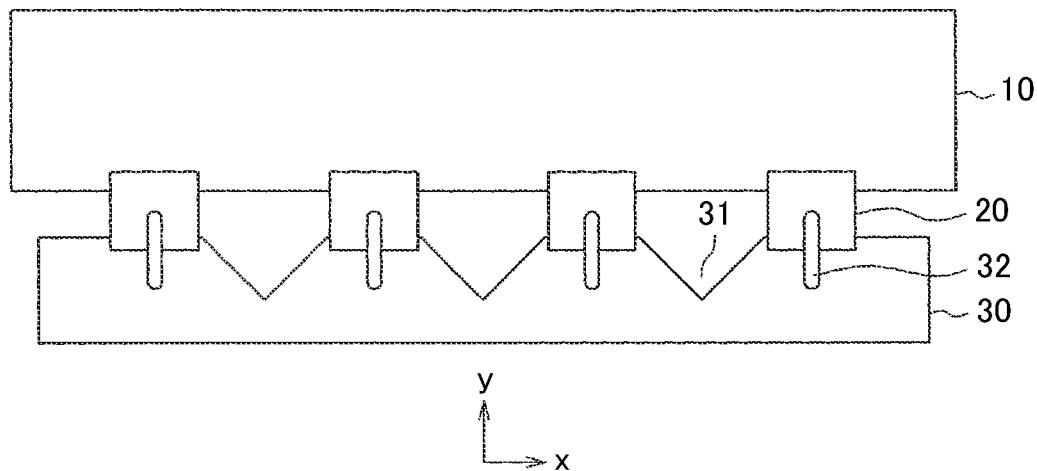
FIG. 33 is a second example of embodiment 4.

FIG. 33 is an example that the slit 32 is formed at the connection portion between the flexible wiring substrate 20 and the printed circuit board 30 in addition to the V shaped cutout 31 explained in FIG. 32. According to the structure, the printed circuit board 30 can be easily deformed; thus, stress at the connection terminals between the display panel 10 and the flexible wiring substrates 20 and between the printed circuit board 30 and the flexible wiring substrates 20 can be mitigated. In addition, the shape or dimensions of the V shaped cutout can be changed between at the center and at the sides of the printed circuit board 30 as explained above; further, the number of the slits at the sides can be different from the number of the slits at the center of the printed circuit board 30.

Figure 34:
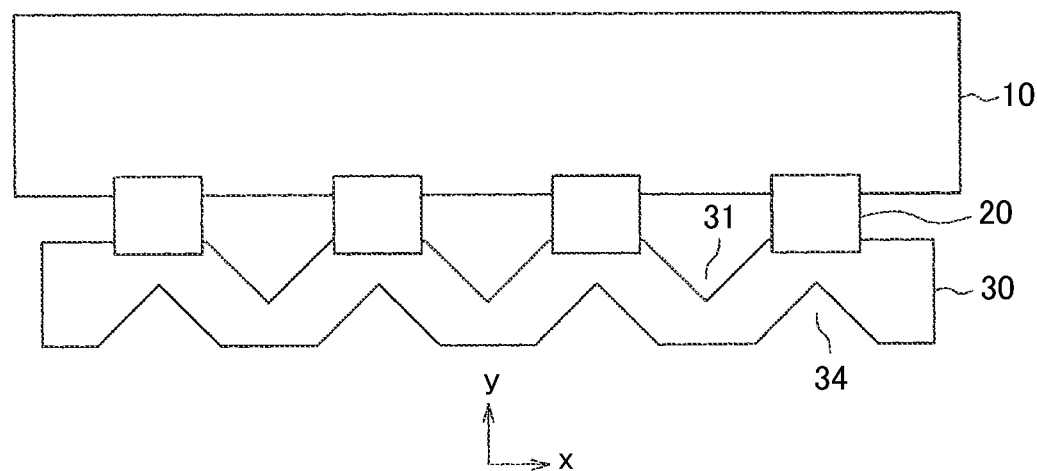
FIG. 34 is a third example of embodiment 4.

FIG. 34 is an example that the V shaped cutouts 34 are formed at the opposite side of the printed circuit board 30 in addition to the V shaped cutouts 31 of FIG. 32. According to this structure, the printed circuit board 30 can be further easily deformed; thus, stress at the connection terminals between the display panel 10 and the flexible wiring substrates 20 and between the printed circuit board 30 and the flexible wiring substrates 20 can be mitigated. In addition, as described above, the shape or dimensions of the V shaped cutouts 31, 34 can be changed between at the center and at the sides of the printed circuit board 30 as explained above.

Figure 35:
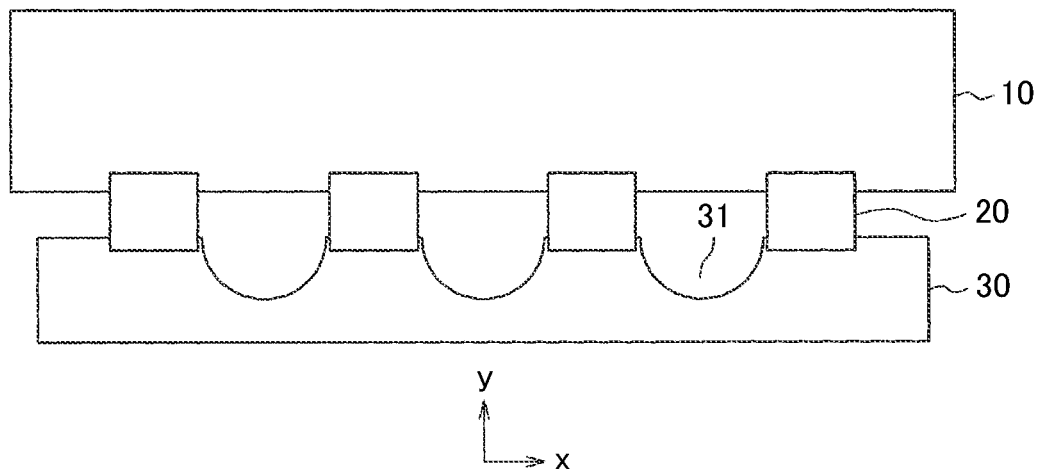
FIG. 35 is a fourth example of embodiment 4.

FIG. 35 is an example that the semicircle shaped cutout 31 is formed in the printed circuit board 30 between the flexible wiring substrates 20 to decrease the stress at the connection portions between the display panel 10 and the flexible wiring substrate 20 and between the printed circuit board 30 and the flexible wiring substrate 20. The dimensions of the semicircle shaped cutout 31 and its function are the same as explained in embodiment 2. In addition, the shape or the dimensions of the semicircle shaped cutout 31 in the printed circuit board 30 can be changed between at the center and at the sides of the printed circuit board 30.

Figure 36:
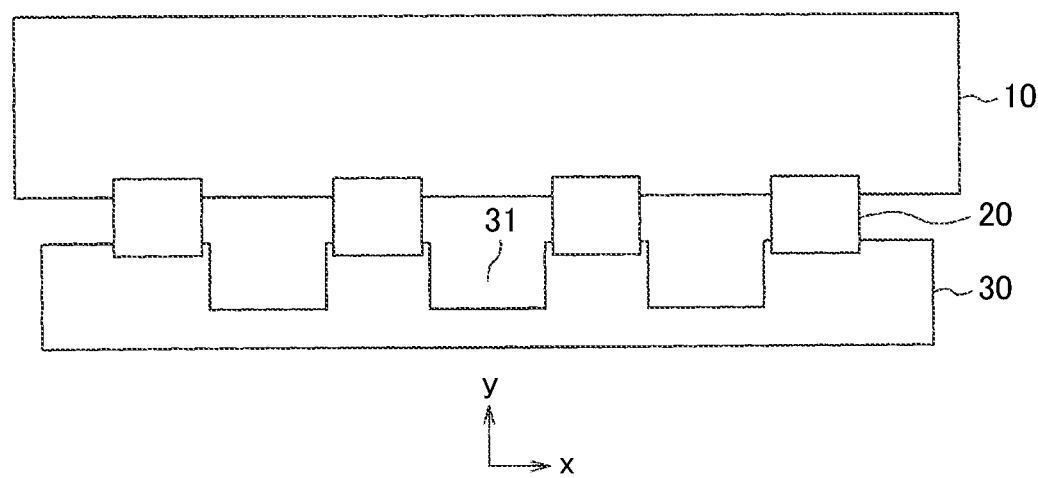
FIG. 36 is a fifth example of embodiment 4.

FIG. 36 is an example that the rectangular shaped cutout 31 is formed in the printed circuit board 30 between the flexible wiring substrates 20 to decrease the stress at the connection portions between the display panel 10 and the flexible wiring substrate 20 and between the printed circuit board 30 and the flexible wiring substrate 20. The dimensions of the rectangular shaped cutout 31 and its function are the same as explained in embodiment 2. In addition, the shape or the dimensions of the rectangular shaped cutout 31 in the printed circuit board 30 can be changed between at the center and at the sides of the printed circuit board 30.

Figure 37:
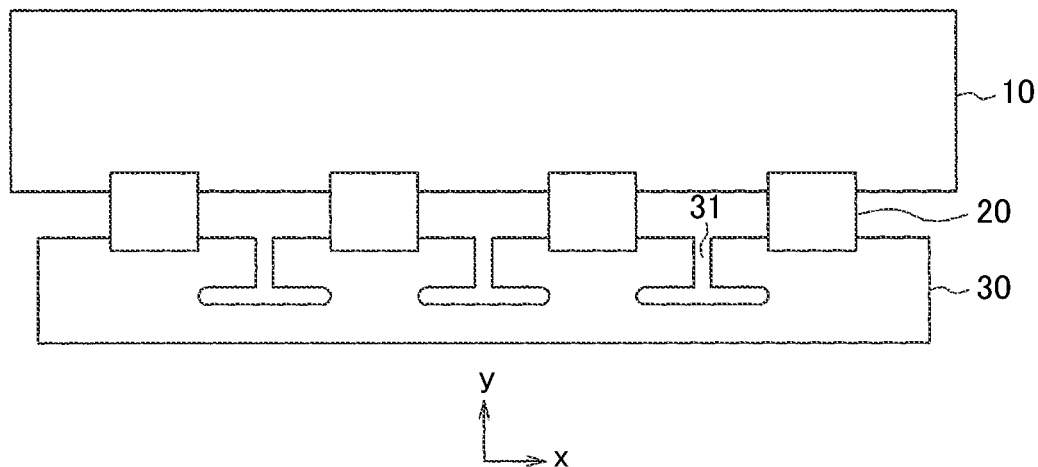
FIG. 37 is a sixth example of embodiment 4.

FIG. 37 is an example that the T shaped cutout 31 is formed in the printed circuit board 30 between the flexible wiring substrates 20 to decrease the stress at the connection portions between the display panel 10 and the flexible wiring substrate 20 and between the printed circuit board 30 and the flexible wiring substrate 20. The dimensions of the T shaped cutout 31 and its function are the same as explained in embodiment 2. In addition, the shape or the dimensions of the T shaped cutout 31 in the printed circuit board 30 can be changed between at the center and at the sides of the printed circuit board 30.

Figure 38:
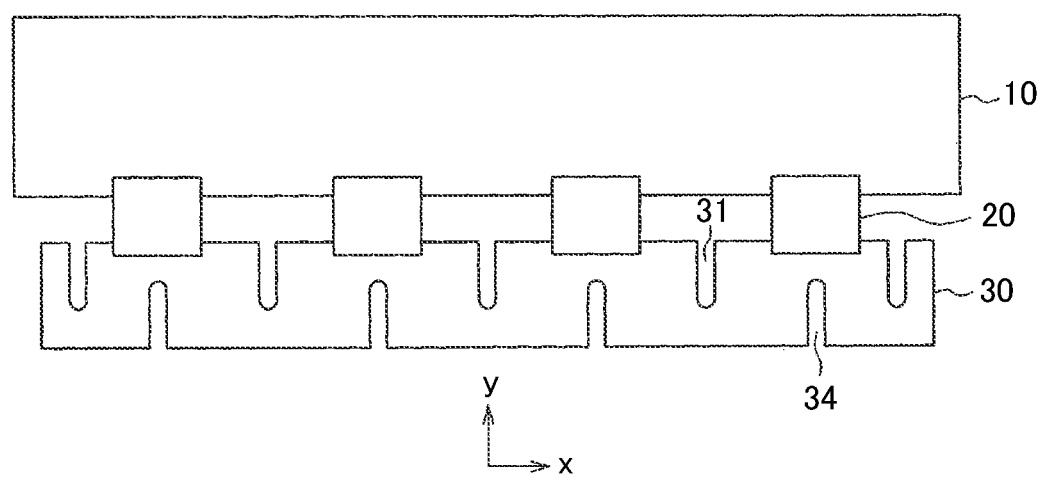
FIG. 38 is a seventh example of embodiment 4.

FIG. 38 is an example that the slit shaped cutout 31 is formed in the printed circuit board 30 between the flexible wiring substrates 20, in addition, the slit shaped cutouts 34 are formed at the opposite side of the printed circuit board 30 to decrease the stress at the connection portions between the display panel 10 and the flexible wiring substrate 20 and between the printed circuit board 30 and the flexible wiring substrate 20. The dimensions of the slit shaped cutouts 31 and 34 are the same as explained in embodiment 2. In FIG. 38, the upper slit shaped cutouts 31 and the lower slit shaped cutouts 34 are formed alternatively in x direction. In addition, the shape or the dimensions of the slit shaped cutouts 31 and 34 in the printed circuit board 30 can be changed between at the center and at the sides of the printed circuit board 30.

Figure 39:
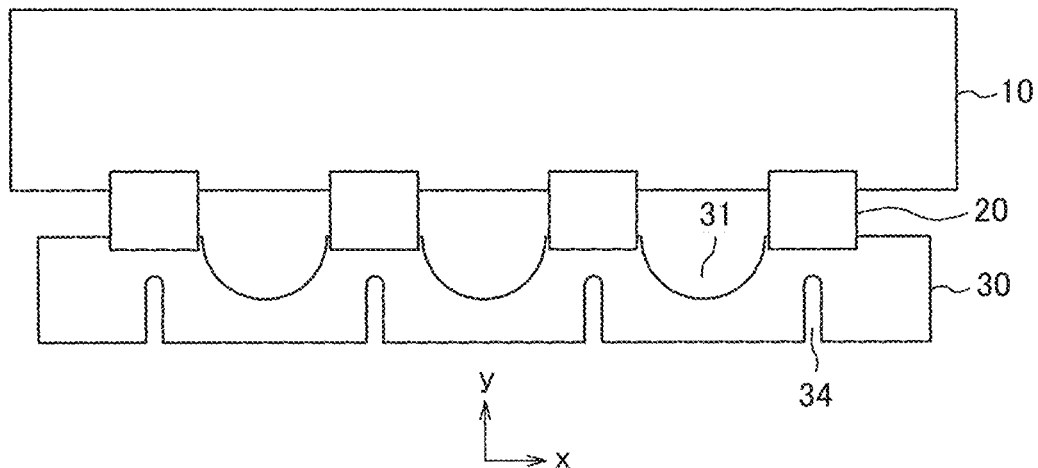
FIG. 39 is an eighth example of embodiment 4.

FIG. 39 is an example that, in addition to the semicircle shaped cutouts 31 explained at FIG. 35, the slit shaped cutouts 43 are formed at the opposite side in y direction of the printed circuit board 30 to decrease the stress at the connection portions between the display panel 10 and the flexible wiring substrate 20 and between the printed circuit board 30 and the flexible wiring substrate 20. The dimensions of each of the slit shaped cutouts 34 are the same as explained in embodiment 2. In FIG. 39, the semicircle shaped cutout 31 and the slit shaped cutout 34 are formed alternatively in x direction. In addition, the shape and dimensions of the semicircle shaped cutout 31 can be changed between at the center and at the sides of the printed circuit board 30. Further, the shape and dimensions of the slit shaped cutout can be changed between at the center and at the sides of the printed circuit board 30.

Figure 40:
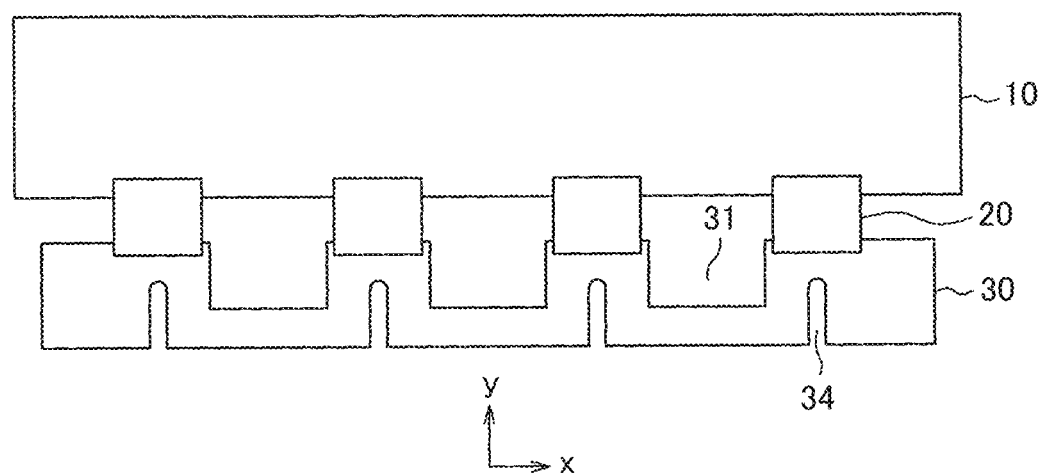
FIG. 40 is a ninth example of embodiment 4.

FIG. 40 is an example that, in addition to the rectangular shaped cutouts 31 explained at FIG. 36, the slit shaped cutouts 43 are formed at the opposite side in y direction of the printed circuit board 30 to decrease the stress at the connection portions between the display panel 10 and the flexible wiring substrate 20 and between the printed circuit board 30 and the flexible wiring substrate 20. The dimensions of each of the slit shaped cutouts 34 are the same as explained in embodiment 2. In FIG. 40, the rectangular cutout 31 and the slit shaped cutout 34 are formed alternatively in x direction. In addition, the shape and dimensions of the rectangular cutout 31 can be changed between at the center and at the sides of the printed circuit board 30. Further, the shape and dimensions of the slit shaped cutout can be changed between at the center and at the sides of the printed circuit board 30.

Figure 41:
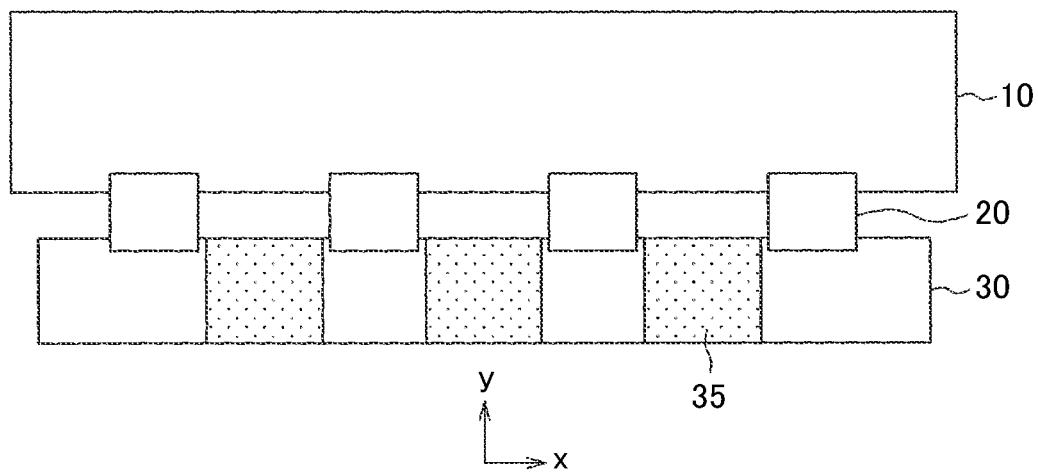
FIG. 41 is a tenth example of embodiment 4.

FIG. 41 is an example that the thin portion 35, explained in embodiment 3, is formed in the printed circuit board 30 between the flexible wiring substrates 20 to decrease the stress at the connection portions between the display panel 10 and the flexible wiring substrate 20 and between the printed circuit board 30 and the flexible wiring substrate 20. The structure and function of the thin portion 35 are the same as explained in embodiment 3. The shape and dimensions of the thin portion 35 are the same as explained in FIG. 27. In addition, as described above, the shape and the thickness of the thin portion 35 can be changed at the center and at the sides of the printed circuit board 30.

Figure 42:
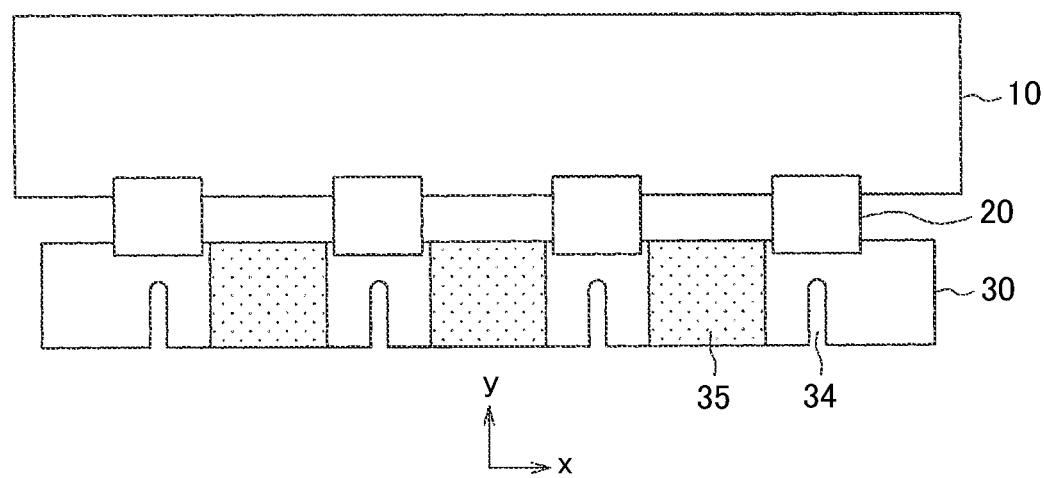
FIG. 42 is an eleventh example of embodiment 4.

FIG. 42 is an example that, in addition to the structure of FIG. 41, the slit shaped cutouts 43 are formed at the opposite side in y direction of the printed circuit board 30 to decrease the stress at the connection portions between the display panel 10 and the flexible wiring substrate 20 and between the printed circuit board 30 and the flexible wiring substrate 20. The dimensions of each of the slit shaped cutouts 34 are the same as explained in FIG. 25 of embodiment 2. In FIG. 42, the thin portion 35 and the slit shaped cutout 34 are formed alternatively in x direction. In addition, the shape and dimensions of the thin portion 35 can be changed between at the center and at the sides of the printed circuit board 30. Further, the shape and dimensions of the slit shaped cutouts 43 can be changed between at the center and at the sides of the printed circuit board 30.

The thin portions 35 in the printed circuit board 30 in FIGS. 41 and 42 are formed through entire width in y direction of the printed circuit board 30; however, as explained by FIG. 30 of embodiment 3, the thin portion 35 can be formed in part of the width in y direction of the printed circuit 30. The dimensions in this case are the same as explained in FIG. 30.

In the above explanation, the invention is explained with respect to the display devices as the liquid crystal display device, the organic EL display device, the micro LED display device; however, the present invention can be applied to the devices comprising: curved substrate, the flat circuit board, and they are connected by two or more flexible wiring substrates, and wherein the two or more flexible wiring substrates are connected to the curved surface.

In the above example, the invention is explained when the surface of the display panel is curved and the print circuit board is flat. The present invention is, however, applicable to the case that both of the display panel and the printed circuit board are curved. Namely, for example, if the radiuses of curvature are different between the display panel and the printed circuit board 30, a stress is generated at the connection portion when those are connected by two or more flexible wiring substrates.

In addition, even the radius of curvature is the same between the display panel and the printed circuit board, a stress is generated when the printed circuit board is folded to the back of the display panel. Even in that case, the structure of the present invention, explained in embodiments 1-4 can mitigate the stress at the connection portions between the display panel 10 and the flexible wiring substrate 20 and between the printed circuit board 30 and the flexible wiring substrate 20.

What is claimed is:

1. A display device comprising: a substrate having a curved surface curved along a first direction, a single printed circuit board, and plural flexible wiring substrates, wherein each of two of the plural flexible wiring substrates has a terminal portion that is connected to the curved surface of the substrate, each of the two of the plural flexible wiring substrates has another terminal portion that is connected to the single printed circuit board, the single printed circuit board is rigid, the single printed circuit board is folded in a flat state to a back of the substrate through the plural flexible wiring substrate, a major surface of the single printed circuit board is not parallel to the curved surface of the substrate in the first direction, the single printed circuit board has a cutout at a side opposing to the substrate between the two flexible wiring substrates, and a tip of the cutout is semicircle; and wherein a controller IC and a power generation circuit are installed in the single printed circuit board, the controller IC is connected to each of the two flexible wiring substrates, the power generation circuit is connected to each of the two flexible wiring substrates, and the cutout is located between the controller IC and the power generation circuit.

2. The display device according to claim 1, wherein
a distance between the two flexible wiring substrates is $W1$, and a width of an opening of the cutout is $W2$, and there is a relation $0.1 \times W1 \leq W2 \leq 0.4 \times W1$.

3. The display device according to claim 2, wherein
a width of the single printed circuit board in a second direction intersecting with the first direction is $L1$, and a depth of the opening of the cutout in the second direction is $L2$, and
there is a relation $0.3 \times L1 \leq L2 \leq 0.7 \times L1$.

4. A display device comprising: a substrate having a curved surface curved along a first direction, a single printed circuit board, and plural flexible wiring substrates, wherein each of two of the plural flexible wiring substrates has a terminal portion that is connected to the curved surface of the substrate, each of the two of the plural flexible wiring substrates has another terminal portion that is connected to the single printed circuit board, the single printed circuit board is rigid, the single printed circuit board is folded in a flat state to a back of the substrate through the plural flexible wiring substrate, a major surface of the single printed circuit board is not parallel to the curved surface of the substrate in the first direction, the single printed circuit board has a cutout at a side opposing to the substrate between the two flexible wiring substrates, and a shape of the cutout is semicircle; and wherein a controller IC and a power generation circuit are installed in the single printed circuit board, the controller IC is connected to each of the two flexible wiring substrates, the power generation circuit is connected to each of the two flexible wiring substrates, and the cutout is located between the controller IC and the power generation circuit.

5. The display device of claim 4, wherein a center of the cutout is at a center of a space between the two flexible wiring substrates.

6. The display device of claim 4, wherein
a distance between the two flexible substrates is $W1$, and a width of an opening of the cutout is $W2$, and
there is a relation $0.4 \times W1 \leq W2 \leq 1.0 \times W1$.

7. The display device of claim 6, wherein
a width of the single printed circuit board in a second direction intersecting with the first direction is $L1$, and a depth of the opening of the cutout in the second direction is $L2$, and
there is a relation $0.3 \times L1 \leq L2 \leq 0.7 \times L1$.

* * * * *